United States Patent
Jung et al.

(10) Patent No.: US 9,858,983 B2
(45) Date of Patent: Jan. 2, 2018

(54) MEMORY DEVICE HAVING LATENCY CONTROL CIRCUIT FOR CONTROLLING DATA WRITE AND READ LATENCY

(71) Applicant: Samsung Electronics Co., Ltd., Suwon-si (KR)

(72) Inventors: Han-gi Jung, Suwon-si (KR); Young-kwon Jo, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/220,744

(22) Filed: Jul. 27, 2016

(65) Prior Publication Data

US 2017/0140808 A1 May 18, 2017

(30) Foreign Application Priority Data

Nov. 12, 2015 (KR) .................. 10-2015-0159005

(51) Int. Cl.
| | | |
|---|---|---|
| *G11C 11/4093* | (2006.01) | |
| *G11C 11/408* | (2006.01) | |
| *G11C 11/4096* | (2006.01) | |
| *G11C 11/4076* | (2006.01) | |
| *G11C 7/22* | (2006.01) | |

(52) U.S. Cl.
CPC .......... *G11C 11/4093* (2013.01); *G11C 7/227* (2013.01); *G11C 11/4076* (2013.01); *G11C 11/4096* (2013.01); *G11C 2207/229* (2013.01); *G11C 2207/2272* (2013.01)

(58) Field of Classification Search
CPC ............ G11C 11/4093; G11C 11/4076; G11C 11/4087; G11C 11/4096
See application file for complete search history.

(56) References Cited

U.S. PATENT DOCUMENTS

| | | |
|---|---|---|
| 7,042,799 B2 | 5/2006 | Cho |
| 7,213,100 B2 | 5/2007 | Lee |
| 7,355,922 B2 | 4/2008 | Johnson et al. |
| 7,663,946 B2 | 2/2010 | Kim |
| 7,965,567 B2 | 6/2011 | Hampel et al. |
| 7,975,162 B2 | 7/2011 | Kim et al. |
| 8,984,320 B2 | 3/2015 | Bringivijayaraghavan |
| 2012/0254873 A1* | 10/2012 | Bringivijayaraghavan G11C 7/109 718/102 |
| 2014/0010025 A1* | 1/2014 | Bringivijayaraghavan G11C 7/109 365/189.05 |
| 2014/0226420 A1 | 8/2014 | Best |

* cited by examiner

*Primary Examiner* — Tri Hoang
(74) *Attorney, Agent, or Firm* — Muir Patent Law, PLLC

(57) ABSTRACT

A memory device may include a latency control circuit configured to control a write latency and a read latency. The memory device compensates a write latency corresponding to a write command in response to a clock signal for a delay time on a data input path, and generates a write latency control signal. Write data input to a data bus in response to the write latency control signal is immediately aligned with the clock signal and latched and provided to a memory cell array.

20 Claims, 10 Drawing Sheets

MEMORY DEVICE HAVING LATENCY CONTROL CIRCUIT FOR CONTROLLING DATA WRITE AND READ LATENCY

CROSS-REFERENCE TO RELATED APPLICATION

This application claims priority under 35 U.S.C. §119 to Korean Patent Application No. 10-2015-0159005, filed on Nov. 12, 2015, in the Korean Intellectual Property Office, the disclosure of which is incorporated herein in its entirety by reference.

BACKGROUND

Embodiments of the present disclosure relate to a semiconductor device, and more particularly, to a memory device having a latency control circuit configured to generate a latency signal activating on an input circuit and an output circuit, at a time point based on a clock signal.

In a dynamic random access memory (DRAM), a command may be typically input in synchronization with a clock signal CLK, and data may be typically input and output in synchronization with a data strobe signal DQS. When a write command is applied to the DRAM, a write signal may be generated based on the clock signal CLK, and provided to a data input circuit as a write latency signal for latching write data after a write latency WL indicated by a multiple of a clock cycle. The data input circuit may receive write data based on the data strobe signal DQS, align and latch the write data in response to the write latency signal, and transmit the latched write data to a memory cell array of the DRAM.

The write data input based on the data strobe signal DQS and the write latency signal generated based on the clock signal CLK may be provided in different domain regions. In semiconductor devices of the different domain regions, delay times may vary due to differences in characteristics between the semiconductor devices, which are caused by process variation and temperature (PVT). Thus, a setup alignment margin or hold alignment margin between the write latency signal and the write data may be deficient, thereby resulting in occurrence of missing data.

SUMMARY

The present disclosure provides a latency control circuit configured to generate a latency signal at a time point based on a clock signal in a data write operation and a data read operation.

Also, the present disclosure provides a memory device including the latency control circuit.

According to an aspect of the present disclosure, there is provided a latency control circuit including a latency compensation circuit configured to generate a latency selection signal according to a loop delay pulse corresponding to a first delay time that is taken for a clock signal to reach a data input circuit configured to receive write data, a delay circuit configured to generate, in response to the latency selection signal, a first write delay signal at a time point, which leads a write latency corresponding to a write command by the first delay time, and a data input path replica circuit configured to delay the first write delay signal by the first delay time, and output a latency control signal. The latency control signal aligns write data and the clock signal, which is input after the write latency, and latches the write data as internal write data.

According to another aspect of the present disclosure, there is provided a memory device including a clock buffer configured to receive a clock signal and output an internal clock signal, a command decoder configured to receive a write command and output a write signal, a latency control circuit configured to compensate, in response to the internal clock signal, a write latency corresponding to the write command for a first delay time on a data input path, and generate a latency control signal, and a data input circuit configured to latch write data input to a data bus, in response to the latency control signal.

According to still another aspect of the present disclosure, there is provided a memory device including a memory cell array configured to write data based on a write latency according to a write command. The memory device includes a clock buffer configured to receive a clock signal and output an internal clock signal, a command decoder configured to receive the write command and output a write signal in response to the internal clock signal, a first circuit configured to receive the write signal and generate a first write delay signal aligned with the internal clock signal, the first write delay signal output at a first time point which is a time leading a first delay time before an ending time of the write latency, a second circuit configured to generate a latency control signal by delaying the first write delay signal for the first delay time, and a data input circuit configured to transmit write data aligned with the internal clock signal in response to the latency control signal.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Figure 1:
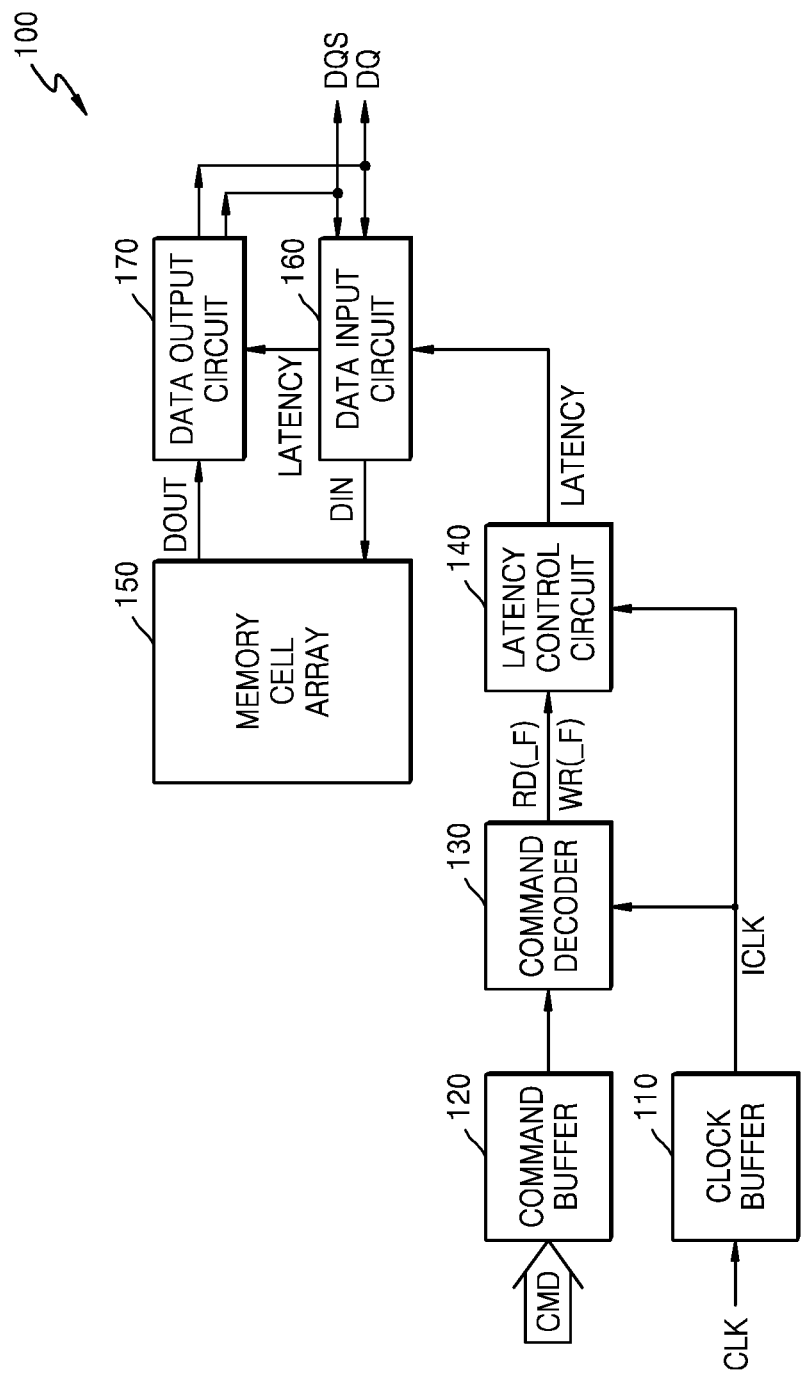
FIG. 1 is a diagram of a memory device including a latency control circuit according to example embodiments.

The present disclosure will now be described more fully hereinafter with reference to the accompanying drawings, in which various embodiments are shown. The invention may, however, be modified in various ways and take on various alternative forms, specific embodiments thereof are shown in the drawings and described in detail below as example embodiments. There is no intent to limit the invention to the particular forms disclosed. Furthermore, any consistency of detail between various examples should not be interpreted as requiring such detail—it is impracticable to list every possible variation for every feature described herein. The language of the claims should be referenced in determining the requirements of the invention. Like reference numerals refer to like elements throughout.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

FIG. 1 is a diagram of a memory device 100 including a latency control circuit according to example embodiments.

Referring to FIG. 1, the memory device 100 may include a clock buffer 110, a command buffer 120, a command decoder 130, a latency control circuit 140, a memory cell array 150, a data input circuit 160, and a data output circuit 170. The memory device 100 may be interpreted as a synchronous dynamic random access memory (SDRAM).

The clock buffer 110 may receive a clock signal CLK and generate an internal clock signal ICLK. The internal clock signal ICLK may be provided to various circuit blocks of the memory device 100.

The command buffer 120 may receive command signals CMD, such as a clock enable signal CKE, a chip selection signal/CS, a row address strobe signal/RAS, a column address strobe signal/CAS, and a write enable signal/WE, and provide the command signals CMD to the command decoder 130.

The command decoder 130 may decode the command signals CMD and generate control signals corresponding to the command signals CMD. The command decoder 130 may generate a read signal RD corresponding to a read command signal CMD, and generate a write signal WR corresponding to a write command signal CMD. The read signal RD, which is a signal for controlling a read operation of the memory device 100, may be provided to various circuit blocks of the memory device 100. The write signal WR, which is a signal for controlling a write operation of the memory device 100, may be provided to various circuit blocks of the memory device 100.

The read signal RD and the write signal WR generated by the command decoder 130 may be provided to the latency control circuit 140 and activate as a flag signal for supporting a read latency RL or a write latency WL that is provided in standards of the memory device 100. Thus, the read signal RD provided to the latency control circuit 140 may be referred to as a read flag signal RD_F, and the write signal WR provided to the latency control circuit 140 may be referred to as a write flag signal WR_F. For example, the read latency RL and the write latency WL may be indicated as n×tCK, n is a positive integer and tCK is one clock cycle of the clock signal CLK.

The write flag signal WR_F may be a signal for controlling a write operation of the memory device 100, in the same way as a write delay signal WR_D and a write latch signal WR_DLL to be described later. The write flag signal WR_F, the write delay signal WR_D, and the write latch signal WR_DLL, which are divided from each other for brevity, may collectively be referred to as write signals.

The latency control circuit 140 may delay a read flag signal RD_F or a write flag signal WR_F in response to the internal clock signal ICLK provided by the clock buffer 110 and output a latency signal LATENCY. The latency control circuit 140 may generate a latency control signal LATENCY based on the internal clock signal ICLK and provide the latency control signal LATENCY to the data input circuit 160 or the data output circuit 170. Operations of the latency control circuit 140 will be described in detail later.

In example embodiments, the latency control signal LATENCY may be generated by compensating the write latency WL for a first delay time tSAC, which is a time taken for the internal clock signal ICLK to reach the data input circuit 160 on a data input path. For example, the latency control circuit 140 may generate a first internal signal (e.g., write delay signal WR_D in FIG. 2) at a first time point which is a time leading the first delay time tSAC before an ending time of the write latency WL, and generate the latency control signal LATENCY by delaying the first internal signal for the first delay time tSAC. In some embodiments, the latency control signal LATENCY may be generated by compensating the write latency WL for a second delay time tWRCMD, which is a time taken for the write command signal CMD to reach the latency control circuit 140 on a command path. For example, the latency control circuit 140 may generate a second internal signal (e.g., write delay signal WR_D in FIG. 2) at a second time point which is a time leading the second delay time tWRCMD, and generate the latency control signal LATENCY by delaying the second internal signal for the second delay time tWRCMD. The second time point may be determined based on a time taken for the write command to reach the latency control circuit 140. In some embodiments, the latency control signal LATENCY may be generated by compensating the write latency WL for a third delay time tSAC+tWRCMD, which is the sum of the first delay time tSAC and the second delay time tWRCMD. For example, the latency control circuit 140 may generate a third internal signal (e.g., write delay signal WR_D in FIG. 2) at a third time point which is a time leading the third delay time tSAC+tWRCMD, and generate the latency control signal LATENCY by delaying the third internal signal for the third delay time tSAC+tWRCMD.

In example embodiments, the latency control signal LATENCY may be generated by compensating the read latency RL for a fourth delay time tSAC, which is taken for the internal clock signal ICLK to reach the data output circuit 170 on the data output path. In some embodiments, the latency control signal LATENCY may be generated by compensating the read latency RL for a fifth delay time tRDCMD, which is taken for the read command signal CMD to reach the latency control circuit 140 on the command path. In some embodiments, the latency control signal LATENCY may be generated by compensating the read latency RL for a sixth delay time tSAC+tRDCMD, which is the sum of the fourth delay time tSAC1 and the fifth delay time tRDCMD.

The memory cell array 150 may include a plurality of memory cells arranged in rows and columns. Each of the memory cells may include a single access transistor and a single storage capacitor. The memory cells may be respectively arranged at intersections between word lines and bit lines that form a matrix. Data provided by a memory controller outside the memory device 100 may be written in the memory cells of the memory cell array 150.

According to an embodiment, a memory cell array 150 may be embodied as a three-dimensional (3D) memory array. The 3D memory cell array is monolithically formed in one or more physical levels of arrays of memory cells having an active area provided above a silicon substrate and circuitry associated with the operation of the memory cells, wherein such associated circuitry may be above or within the silicon substrate. The term "monolithic" means that layers of each level of the memory cell array 150 are directly stacked on the layers of each underlying level of the memory cell array 150.

The following patent documents, which are hereby incorporated by reference, disclose suitable configurations for 3D memory arrays, in which the 3D memory array is configured at a plurality of levels, with word lines and/or bit lines shared between levels: U.S. Pat. Nos. 7,679,133; 8,553,466; 8,654,587; 8,559,235; and US Pat. Pub. No. 2011/0233648.

The data input circuit 160 may include a data input buffer to receive write data transmitted by a data pad DQ, and a data strobe buffer to receive a data strobe signal transmitted by a data strobe pad DQS. The data input circuit 160 may align the write data and the data strobe signal, and latch the write data, which is input via the data pad DQ, in response to the latency control signal LATENCY, and provide the latched write data as internal write data DIN to the memory cell array 150. Since the latency control signal LATENCY acting on the data input circuit 160 is generated based on the write latency WL, the latency control signal LATENCY may be referred to as a write latency control signal.

The data input circuit 160 may provide internal write data DIN in response to the latency control signal LATENCY generated by compensating for delay times on the data input path and/or the command path. Since the latency control signal LATENCY is generated by compensating for delay times on the data input path and/or the command path, the latency control signal LATENCY may be applied to the data input circuit 160 in alignment with write data, which is input to the data bus DQ in synchronization with a data strobe signal DQS. Thus, the write data input to the data bus DQ may be immediately aligned and latched and provided as internal write data DIN to the memory cell array 150.

When the write data input to the data bus DQ is immediately aligned and latched in response to the latency control signal LATENCY generated in one clock signal domain region, it may also mean that the write data input to the data bus DQ does not need to stand by in the data input circuit 160. Also, it may mean that it is unnecessary to consider a deficiency in alignment margin between the latency control signal LATENCY and the write data, which may occur due to a process variation and temperature (PVT) between different domain regions (e.g., a clock domain and a DQS domain). Therefore, the memory device 100 may perform stable high-speed write operations.

The data output circuit 170 may output read data DOUT of the memory device 100 to the data bus DQ in response to the latency control signal LATENCY. The data output circuit 170 may include a data output buffer and a data strobe buffer. Since the latency control signal LATENCY acting on the data output circuit 170 is generated based on the read latency RL, the latency control signal LATENCY may be referred to as a read latency control signal. The data output circuit 170 may output read data DOUT, which is read from the memory cell array 150, in response to the latency control signal LATENCY generated by compensating delay times on a data output path and/or a command path.

Figure 2:
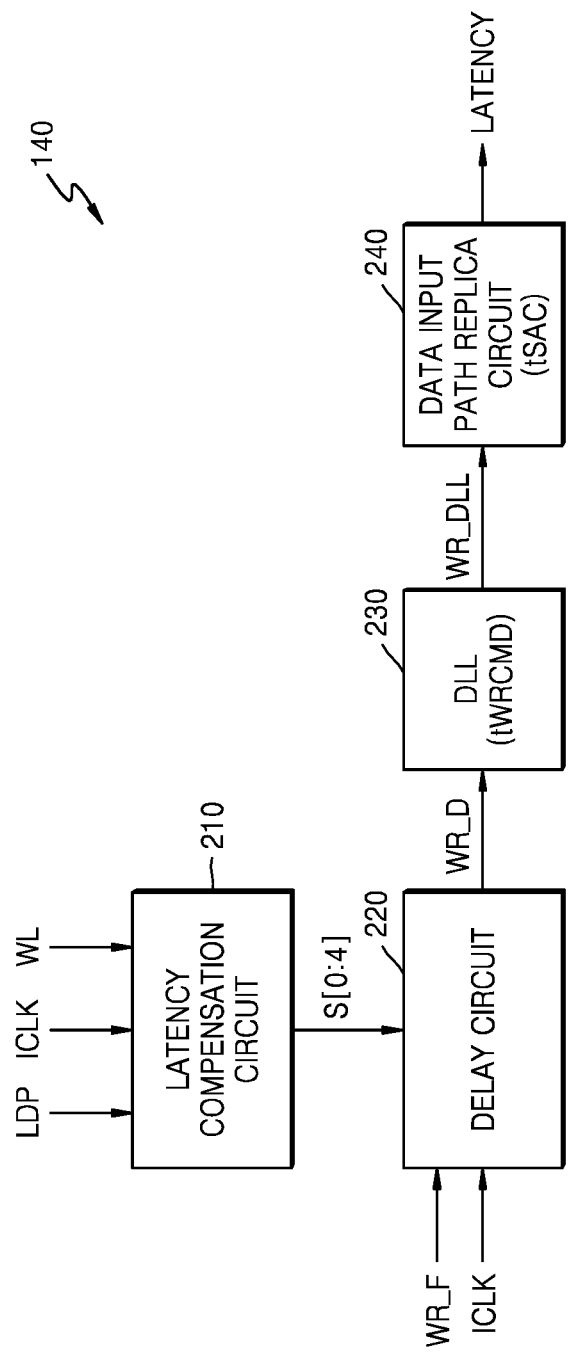
FIG. 2 is a block diagram of the latency control circuit of FIG. 1 according to example embodiments.

FIG. 2 is a block diagram of the latency control circuit 140 of FIG. 1 according to example embodiments.

Referring to FIG. 2, the latency control circuit 140 may generate the latency control signal LATENCY based on the internal clock signal ICLK, the write latency WL, a loop delay pulse LDP, and the write flag signal WR_F. The latency control circuit 140 may include a latency compensation circuit 210, a delay circuit 220, a delay locked loop (DLL) circuit 230, and a data input path replica circuit 240.

In general, a latency is a data input/output (I/O) rule made between the memory device (refer to 100 in FIG. 1) and a memory controller. After a predetermined number of clock cycles (i.e., a predetermined read latency RL) from a time point at which a read command of the memory controller is input, it is expected to load effective read data of the memory device 100 on the data bus DQ between the memory device 100 and the memory controller. Also, after a predetermined number of clock cycles (i.e., a predetermined write latency WL) from a time point at which a write command of the memory controller is input, it is expected to load write data to be written to the memory device 100 on the data bus DQ between the memory device 100 and the memory controller.

In the present embodiment, the latency control circuit 140 configured to generate the latency control signal LATENCY based on the write latency WL related to a write operation of the memory device 100 will be described. In some embodiments, the latency control circuit 140 may generate the latency control signal LATENCY based on the read latency RL related to a read operation of the memory device 100.

The latency compensation circuit 210 may generate a latency selection signal S[0:4] according to the loop delay pulse LDP in response to the internal clock signal ICLK. The loop delay pulse LDP may be a pulse signal indicating a first delay time tSAC that is taken for the internal clock signal ICLK provided by the clock buffer (refer to 110 in FIG. 1) to reach the data input circuit 160. In some embodiments, the loop delay pulse LDP may be a pulse signal indicating a third delay time tSAC+tWRCMD, which is the sum of the first delay time tSAC and the second delay time tWRCMD that is taken for the write command signal CMD serving as the write flag signal WR_F to the latency control circuit (refer to 140 in FIG. 1). The latency selection signal S[0:4] may be provided to the delay circuit 220.

The delay circuit 220 may delay a write flag signal WR_F according to a latency selection signal S[0:4] in response to the internal clock signal ICLK, and generate a write delay signal WR_D at a time point that leads the write latency WL by the first delay time tSAC. In some embodiments, the delay circuit 220 may delay the write flag signal WR_F according to the latency selection signal S[0:4] in response to the internal clock signal ICLK, and generate the write delay signal WR_D at a time point that leads the write latency WL by the third delay time tSAC+tWRCMD. The write delay signal WR_D may be provided to the DLL circuit 230.

In example embodiments, the write delay signal WR_D may be aligned with the internal clock signal ICLK due to sampling of the write flag signal WR_F in response to the internal clock signal ICLK.

The DLL circuit 230 may delay the write delay signal WR_D by a second delay time tWRCMD, which is taken for the write command signal CMD serving as the write flag signal WR_F to reach the latency control circuit (refer to 140 in FIG. 1), and output a write latch signal WR_DLL. The write latch signal WR_DLL output by the DLL circuit 230 may be phase-aligned with the internal clock signal ICLK. The write latch signal WR_DLL may be provided to the data input path replica circuit 240.

The data input path replica circuit 240 may delay the write latch signal WR_DLL by a first delay time tSAC, which is taken for the internal clock signal ICLK to reach the data input circuit 160, and output a latency control signal LATENCY.

The latency control signal LATENCY may be generated by compensating the write latency WL for the first delay time tSAC of the internal clock signal ICLK on the data input path and the second delay time tWRCMD of the write command signal CMD on the command path. Thus, the latency control signal LATENCY may be applied to the data input circuit 160 in alignment with write data that is input to the data bus DQ in synchronization with a data strobe signal DQS. The write data input to the data bus DQ may be immediately aligned and latched in response to the latency control signal LATENCY and transmitted to the memory cell array 150. Therefore, the write data input to the data bus DQ may not need to stand by in the data input circuit 160.

Figure 3:
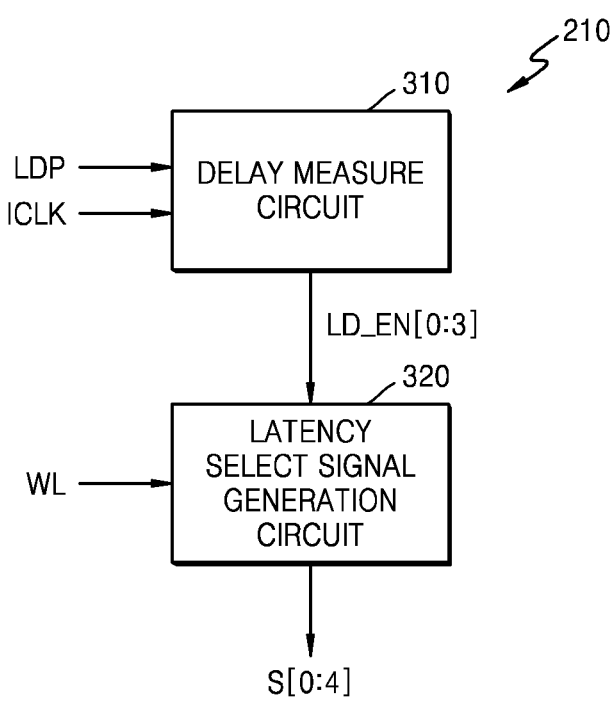
FIG. 3 is a block diagram of a latency compensation circuit of FIG. 2 according to example embodiments.

FIG. 3 is a block diagram of the latency compensation circuit 210 of FIG. 2 according to example embodiments.

Referring to FIG. 3, the latency compensation circuit 210 may include a delay measure circuit 310 and a latency select signal generation circuit 320.

The delay measure circuit 310 may output a loop delay encoding signal LD_EN[3:0] based on the internal clock signal ICLK and the loop delay pulse LDP. The loop delay encoding signal LD_EN[0:3] may be a signal generated by converting the loop delay pulse LDP indicating the first delay time tSAC or the third delay time tSAC+tWRCMD into a binary code. The loop delay encoding signal LD_EN[0:3] may be provided to the latency select signal generation circuit 320.

The latency select signal generation circuit 320 may generate a latency selection signal S[0:4] based on the loop delay encoding signal LD_EN[3:0] and the write latency WL. The latency selection signal S[0:4] may act as a control signal for delaying the write flag signal WR_F and generating a write delay signal (refer to WR_D in FIG. 7) at a time point that leads the write latency WL by the first delay time tSAC or the third delay time tSAC+tWRCMD.

Although the present embodiment describes an example configured to support the write latency WL=4, the inventive concept is not limited thereto, and a write latency WL=n (n is one of various natural numbers other than 4) may be supported. In some embodiments, an operation of supporting the write latency WL may be almost equally applied to an operation of supporting a read latency RL.

A write latency signal WL<n> for supporting the write latency WL=n may be provided. The write latency signal WL<n> may indicate that write data is loaded on a data bus after n clock cycles from a time point at which a write command is input. The memory device 100 may perform a write operation of inputting write data after n clock cycles corresponding to the write latency signal WL<n> from the time point in which the write command is generated.

For example, the memory device 100 may input write data after 1 clock cycle from a time point at which a write command is input, in response to a first write latency signal WL<1>. The memory device 100 may input write data after 2 clock cycles from a time point at which a write command is input, in response to a second write latency signal WL<2>. Also, the memory device 100 may input write data after 3 clock cycles and 4 clock cycles from a time point at which a write command is input, in response to third and fourth write latency signals WL<3> and WL<4>, respectively.

Figure 4:
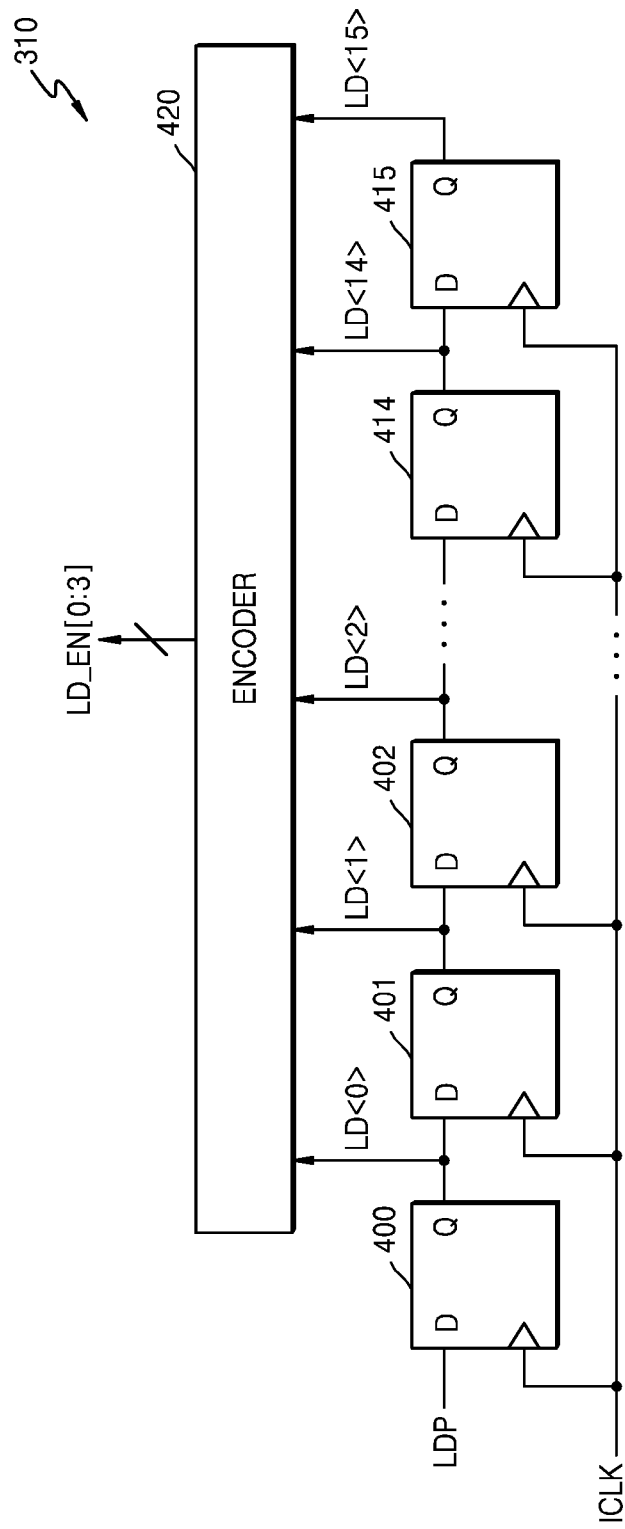
FIGS. 4 and 5 are diagrams of a delay measure circuit of FIG. 3 according to example embodiments.
Figure 5:
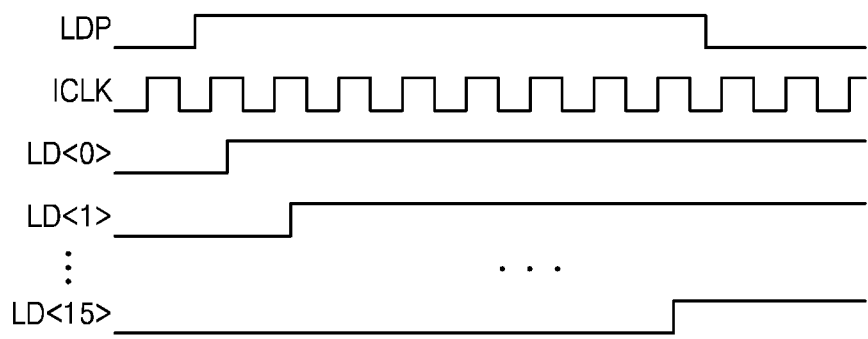

FIGS. 4 and 5 are diagrams of the delay measure circuit 310 of FIG. 3 according to example embodiments. FIG. 4 is a circuit diagram of the delay measure circuit 310, and FIG. 5 is a timing diagram illustrating operations of the delay measure circuit 310.

Referring to FIG. 4, the delay measure circuit 310 may include a plurality of flip-flops 400 to 415, which are connected in series, and an encoder 420 configured to encode outputs LD<0> to LD<15> of the plurality of flip-flops 400 to 415 and output a loop delay encoding signal LD_EN[0:3].

The plurality of flip-flops 400 to 415 may receive a loop delay pulse LDP and output loop delay signals LD<0:16> corresponding to the loop delay pulse LDP. The loop delay pulse LDP may be a pulse shape of a first delay time tSAC that is taken for an internal clock signal ICLK provided by the clock buffer (refer to 110 in FIG. 1) to reach the data input circuit 160. The first delay time tSAC may be an element configured to compensate for a delay on a data input path to which the internal clock signal ICLK acting on the data input circuit 160 is transmitted.

In some embodiments, the loop delay pulse LDP may be a pulse shape of a third delay time tSAC+tWRCMD, which is the sum of the first delay time tSAC and a second delay time tWRCMD that is taken for the common signal CMD serving as the write flag signal WR_F to reach the latency control circuit (refer to 140 in FIG. 1). The second delay time tWRCMD may be an element configured to compensate for a delay on a command path to which the write flag signal WR_F acting on the latency control circuit 140 is transmitted. The third delay time tSAC+tWRCMD may be an element configured to compensate for the first delay time tSAC and the second delay time tWRCMD.

The first flip-flop 400 may latch the loop delay pulse LDP in response to the internal clock signal ICLK and output a first loop delay signal LD<0. The second flip-flop 401 may latch the first loop delay signal LD<0> in response to the internal clock signal ICLK and outputs a second loop delay signal LD<1>. The third flip-flop 402 may latch the second loop delay signal LD<1> in response to the internal clock signal ICLK and output a third loop delay signal LD<2>. Similarly, the sixteenth flip-flop 415 may latch a fifteenth loop delay signal LD<14>, which is an output of a fifteenth flip-flop 414, in response to the internal clock signal ICLK and output a sixteenth loop delay signal LD<15>.

The present embodiment describes an example in which the delay measure circuit 310 includes sixteenth flip-flops, but the inventive concept is not limited thereto. In some embodiments, the delay measure circuit 310 may include various other numbers of flip-flops.

As shown in FIG. 5, first to sixteenth loop delay signals LD<0> to LD<15> output by the first to sixteenth flip-flops 400 to 415 may be sequentially generated in response to the internal clock signal ICLK during a section corresponding to the loop delay pulse LDP.

The encoder 420 may encode the first to sixteenth loop delay signals LD<0> to LD<15> and output a 4-bit loop delay encoding signal LD_EN[3:0]. The loop delay encoding signal LD_EN[0:3] may be a signal generated by converting the loop delay pulse LDP indicating the first delay time tSAC or the third delay time tSAC+tWRCMD into a binary code. The loop delay encoding signal LD_EN[0:3] may be provided to a latency select signal generation circuit 320 of FIG. 6.

Figure 6:
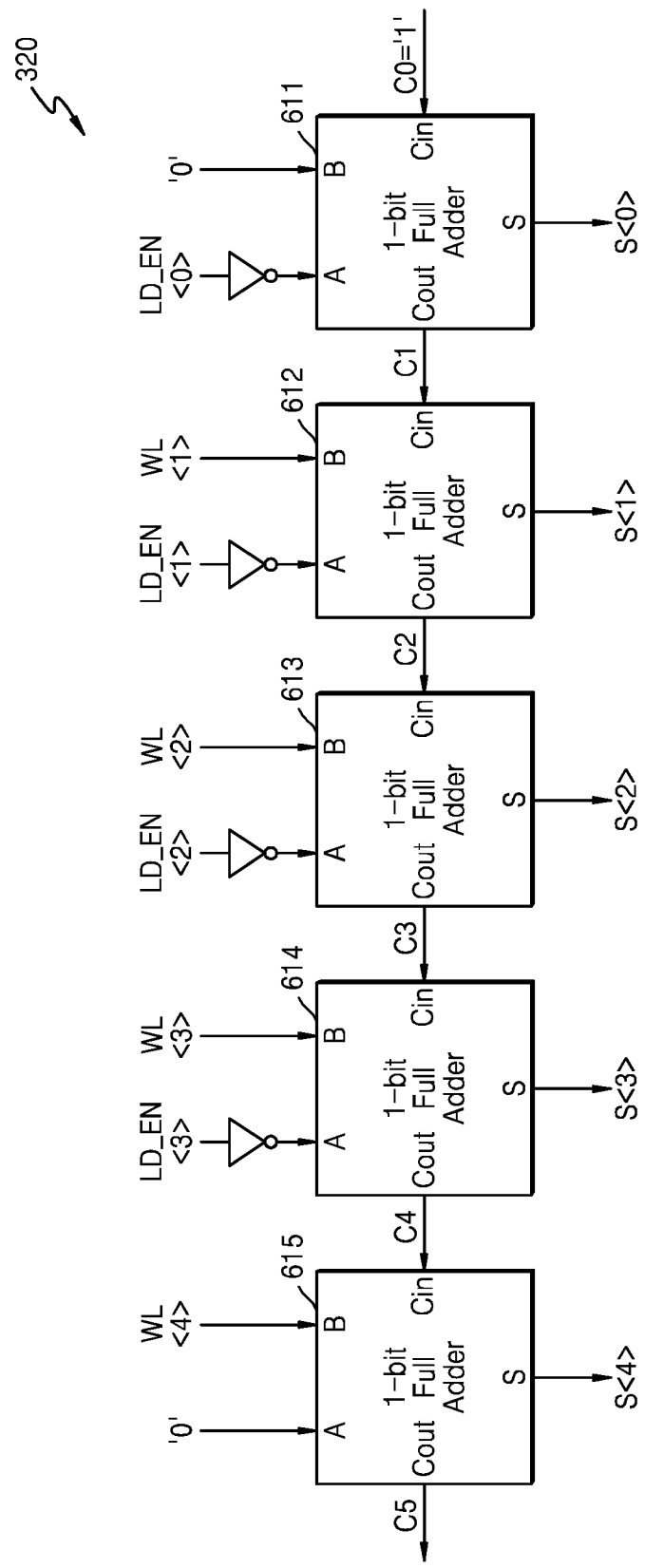
FIG. 6 is a circuit diagram of a latency select signal generation circuit of FIG. 3 according to example embodiments.

FIG. 6 is a circuit diagram of the latency select signal generation circuit 320 of FIG. 3 according to example embodiments.

Referring to FIG. 6, the latency select signal generation circuit 320 may generate a latency selection signal S[0:4] for generating a write delay signal (refer to WR_D in FIG. 7) at a time point that leads a write latency WL by a first delay time tSAC or a third delay time tSAC+tWRCMD, based on a loop delay encoding signal LD_EN[3:0] and the write latency WL. The latency select signal generation circuit 320 may include a plurality of 1-bit full adders 611 to 614 to which the loop delay encoding signal LD_EN[3:0] and write latency signals WL<1> to WL<4> are input. In example embodiments, each of the write latency signals WL<1> to WL<4> may be a bit signal such as "1" or "0". For example, the write latency signal WL<1> may be a least significant bit LSB and the write latency signal WL<4> may be a most significant bit MSB. Thus, when the write latency signals WL<1> to WL<4> is 1010 the write latency is 10 (e.g., 10 tCK).

In a first full adder 611, a first carry signal C0 having a logic '1' may be provided to a carry input Cin, an inverted signal of a first loop delay encoding signal LD_EN<0> may be input to a first input A, and a logic '0' may be input to a second input B. A carry output Cout of the first full adder 611 may be output as a second carry signal C1 and provided to a carry input Cin of a second full adder 612. An output S of the first full adder 611 may be output as a first latency selection signal S<0>.

In the second full adder 612, the second carry signal C1 may be input to the carry input Cin, an inverted signal of a second loop delay encoding signal LD_EN<1> may be input to a first input A, and a first write latency signal WL<1> may be input to a second input B. A carry output Cout of the second full adder 612 may be output as a third carry signal C2 and provided to a carry input Cin of a third full adder 613. An output S of the second full adder 612 may be output as a second latency selection signal S<1>.

Similarly, a third full adder 613 may input the third carry signal C2, an inverted signal of a third loop delay encoding signal LD_EN<2>, and a second write latency signal WL<1>, and output a fourth carry signal C3 and a third latency selection signal S<2>. A fourth full adder 614 may input a fourth carry signal C3, an inverted signal of a fourth loop delay encoding signal LD_EN<3>, and a third write latency signal WL<2> and output a fifth carry signal C4 and a fourth latency selection signal S<3>.

In a fifth full adder 615, a fifth carry signal C4 may be input to a carry input Cin, a logic '0' may be input to a first input A, and a fourth write latency signal WL<4> may be input to a second input B. A carry output Cout of the fifth full adder 615 may be output as a sixth carry signal C5, and an output S of the fifth full adder 615 may be output as a fifth latency selection signal S<4>.

In some embodiments, in the latency select signal generation circuit 320, first to fourth loop delay encoding signals LD_EN<0:3> may be respectively input to the first inputs A of the first to fourth full adders 611 to 614, instead of inverted signals of the first to fourth loop delay encoding signals LD_EN<0:3>, depending on embodied logics.

The first to fifth latency selection signals S[0:4] may act as control signals for delaying the write flag signal WR_F and generating the write delay signal (refer to WR_D in FIG. 7) at a time point that leads the write latency WL by the first delay time tSAC. In some embodiments, the first to fifth latency selection signals S[0:4] may act as control signals for delaying the write flag signal WR_F and generating the write delay signal (refer to WR_D in FIG. 7) at a time point that leads the write latency WL by the third delay time tSAC+tWRCMD. The latency selection signals S[0:4] may be provided to a delay circuit (refer to 220 in FIG. 7).

Figure 7:
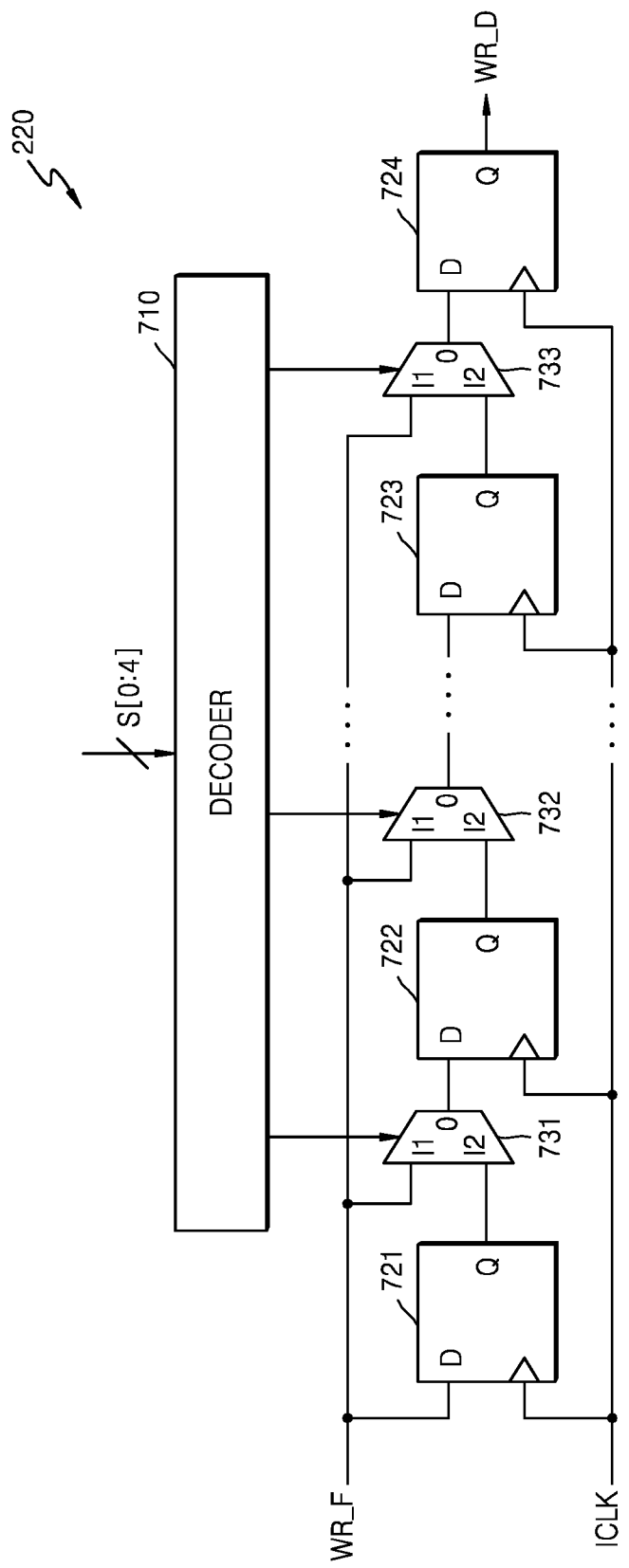
FIG. 7 is a diagram of a delay circuit of FIG. 2 according to example embodiments.

FIG. 7 is a circuit diagram of the delay circuit 220 of FIG. 2 according to example embodiments.

Referring to FIG. 7, the delay circuit 220 may generate a write delay signal WR_D based on a write flag signal WR_F and latency selection signals S[0:4]. The delay circuit 220 may include a decoder 710, a plurality of flip-flops 721 to 724, and a plurality of multiplexers 731 to 733.

The decoder 710 may receive and decode the latency selection signals S[0:4] and provide outputs of the decoder 710 to the plurality of multiplexers 731 to 733. The multiplexers 731 to 733 may select a first input I1 or a second input I2 according to the output of the decoder 710 and output the selected one of the first input I1 or the second input I2 as an output signal O. The output O of the multiplexers 731 to 733 may be provided as a data input D of the flip-flops 722 to 724.

The first flip-flop 721 may latch and output the write flag signal WR_F in response to an internal clock signal ICLK. An output of the first flip-flop 721 may be provided to the second input I2 of the first multiplexer 731. The first multiplexer 731 may select and output one of the write flag signal WR_F of the first input I1 and the output of the first flip-flop 721 of the second input I2 according to the output of the decoder 710.

The second flip-flop 722 may latch and output the output of the first multiplexer 731 in response to the internal clock signal ICLK. The output of the second flip-flop 722 may be provided to the second input I2 of the second multiplexer 732. The second multiplexer 732 may select and output one of the write flag signal WR_F of the first input I1 and the output of the second flip-flop 722 of the second input I2 according to the output of the decoder 710. Similarly, an n-th multiplexer 733 may select and output one of the write flag signal WR_F of the first input I1 and an output of an n-th flip-flop 723 of the second input I2. An n+1-th flip-flop 724 may latch and output the output of the n-th multiplexer 733 in response to the internal clock signal ICLK. An output of the n+1-th flip-flop 724 may be output as a write delay signal WR_D.

The write delay signal WR_D may be output as a write latch signal WR_DLL, which is provided to the DLL circuit (refer to 230 in FIG. 2), delayed by a second delay time tWRCMD, and phase-aligned with the internal clock signal ICLK. The write latch signal WR_DLL may be delayed by a first delay time tSAC by the data input path replica circuit (refer to 240 in FIG. 2) and output as a latency control signal LATENCY.

Figure 8:
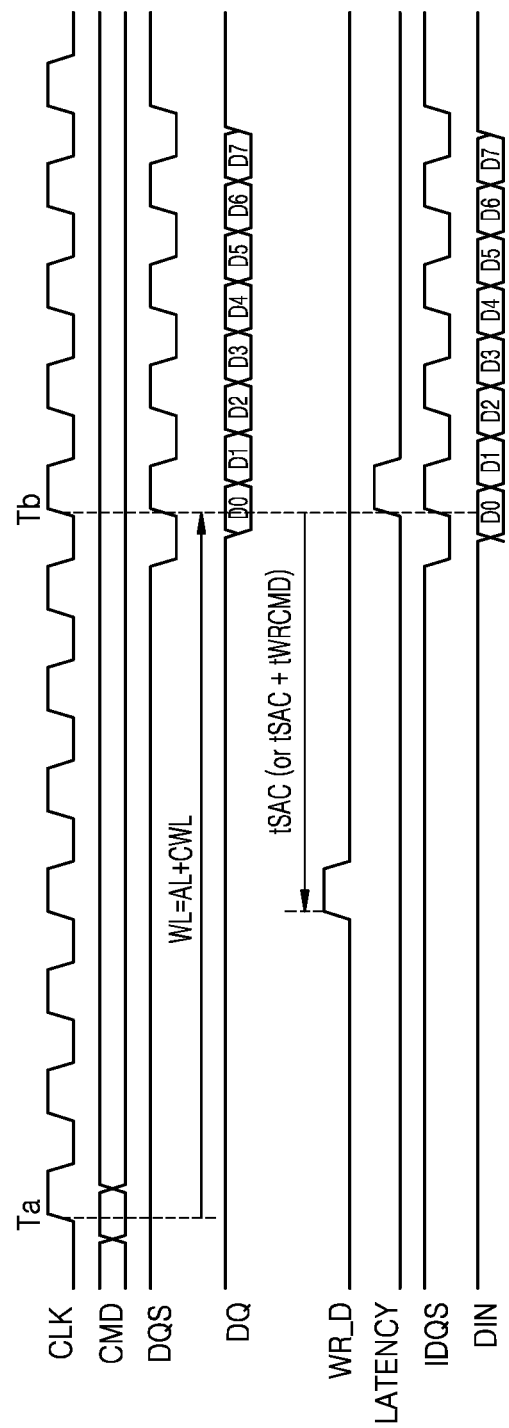
FIG. 8 is a timing diagram of an operation of a memory device having a latency control circuit according to example embodiments.

FIG. 8 is a timing diagram of an operation of a memory device having a latency control circuit according to example embodiments.

Referring to FIG. 8 and the memory device 100 of FIG. 1, a write command CMD may be input in synchronization with a clock signal CLK, and write data may be loaded on a data bus DQ (or a data pad) in synchronization with a data strobe signal at a time point Tb after a write latency WL from a time point Ta at which the write command CMD is input. The write latency WL may be defined as the sum of an additive latency AL and a column access strobe (CAS) write latency CWL, which is defined by a clock cycle delay between an internal write command and a first bit of effective input data.

In example embodiments, the latency control circuit 140 may compensate the write latency WL for a first delay time tSAC on a data input path, which is taken for an internal clock signal ICLK to reach a data input circuit 160, and generate a write delay signal WR_D.

In other example embodiments, the latency control circuit 140 may compensate the write latency WL for a second delay time tWRCMD, which is taken for a write command CMD to reach a latency control circuit 140 on a write command path, and generate a write delay signal WR_D.

In other example embodiments, the latency control circuit 140 may compensate the write latency WL for a sum of the first delay time tSAC and the second delay time tWRCMD, and generate a write delay signal WR_D.

In example embodiments, the latency control circuit 140 may delay the write delay signal WR_D by a second delay time tWRCMD and generate the write latch signal WR_DLL by using the DLL circuit (refer to 230 in FIG. 2), delay the write latch signal WR_DLL by the first delay time tSAC by the data input path replica circuit (refer to 240 in FIG. 2), and generate a latency control signal LATENCY. For example, the first delay time tSAC or the sum of the first delay time tSAC and the second delay time tWRCMD may be 5 when the write latency WL may be 10.

The latency control signal LATENCY may latch the write data on the data bus DQ in alignment with an internal data strobe signal IDQS at the time point Tb and provide the latched write data as internal write data DIN to the memory cell array 150. The internal data strobe signal IDQS may be generated by buffering the data strobe signal DQS and handed in the same way as the data strobe signal DQS.

Accordingly, the write data input to the data bus DQ may not need to stand by in the data input circuit 160 in response to the latency control signal LATENCY but be immediately latched as the internal write data DIN.

Figure 9:
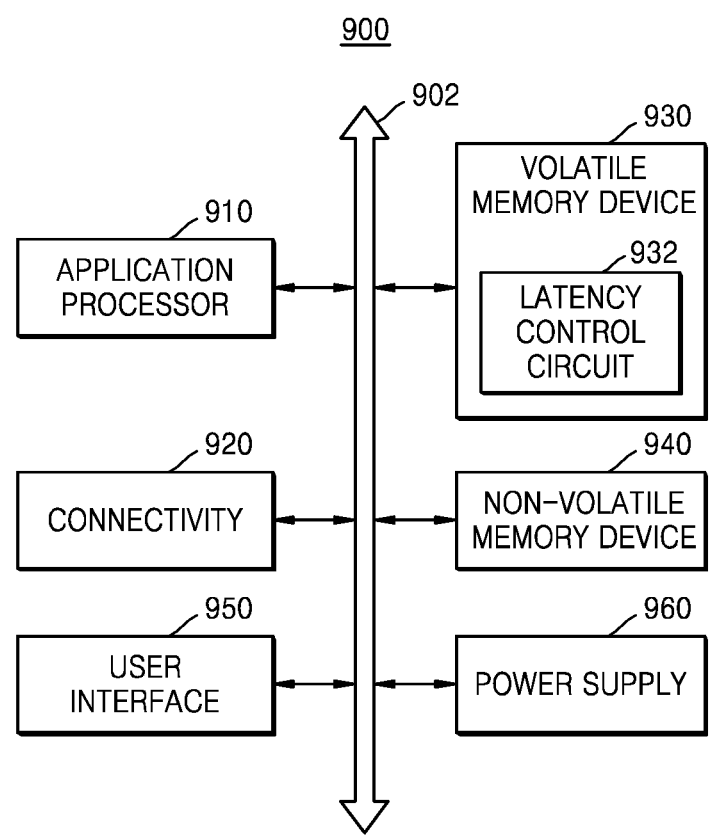
FIG. 9 is a block diagram of a mobile system applying a memory device including a latency control circuit according to a certain embodiment.

FIG. 9 is a block diagram of an example of applying a memory device including a latency control circuit according to certain embodiments to a mobile system 900.

Referring to FIG. 9, the mobile system 900 may include an application processor 910, a connectivity unit 920, a first memory device 930, a second memory device 940, a user interface 950, and a power supply 960, which may be connected to one another via a bus 902. The first memory device 930 may be set as a volatile memory device, and the second memory device 940 may be set as a non-volatile memory device.

In some embodiments, the mobile system 900 may be an arbitrary mobile system, such as a mobile phone, a smartphone, a personal digital assistant (PDA), a portable multimedia player (PMP), a digital camera, a music player, a portable game console, and a navigation system.

The application processor 910 may execute applications capable of providing an Internet browser, a game, and moving images. In some embodiments, the AP 910 may include a single core or a multi-core. For example, the AP 910 may include a dual-core, a quad-core, or a hexa-core. In some embodiments, the AP 910 may further include a cache memory, which is located inside or outside the AP 910.

The connectivity unit 920 may communicate with an external apparatus by wire or wirelessly. For example, the connectivity unit 920 may perform an Ethernet communication operation, a near-field communication (NFC) operation, a radio-frequency identification (RFID) communication operation, a mobile telecommunication operation, a memory card communication operation, and a universal serial bus (USB) communication operation. For example, the connectivity unit 920 may include a baseband chipset and support communications, such as global system for mobile communications (GSM), general packet radio service (GPRS), wideband code division multiple access (WCDMA), and high-speed downlink/uplink packet access (HSxPA).

The first memory device 930, which is a volatile memory device, may store data processed by the application processor 910 as write data or work as a working memory. The first memory device 930 may include the latency control circuit disclosed herein. The latency control circuit, which may compensate a write latency corresponding to a write command for a delay time on a data input path in response to a clock signal and generate a write latency control signal. The memory device 930 may immediately align and latch write data, which is input to a data bus in response to the write latency control signal, and provide the latched write data to a memory cell array. The memory device 930 may compensate a read latency corresponding to a read command for a delay time on a data output path in response to a clock signal and generate a read latency control signal. The memory device 930 may output read data read from the memory cell array in response to the read latency control signal and output the read data to the data bus.

The second memory device 940, which is a non-volatile memory device, may store a boot image for booting the mobile system 900. For example, the second memory device 940 may be embodied by electrically erasable programmable read-only memory (EEPROM), flash memory, phase-change RAM (PRAM), resistive RAM (RRAM), nano-floating gate memory (NFGM), polymer RAM (PoRAM), magnetic RAM (MRAM), ferroelectric RAM (FRAM), or memories similar thereto.

The user interface 950 may include at least one input device (e.g., a keypad and a touch screen) and at least one output device (e.g., a speaker and a display device). The power supply 960 may supply an operating voltage to the mobile system 900. In some embodiments, the mobile system 900 may include a camera image processor (CIP) and further include a storage device, such as a memory card, a solid-state drive (SSD), a hard disk drive (HDD), or CD-ROM.

Figure 10:
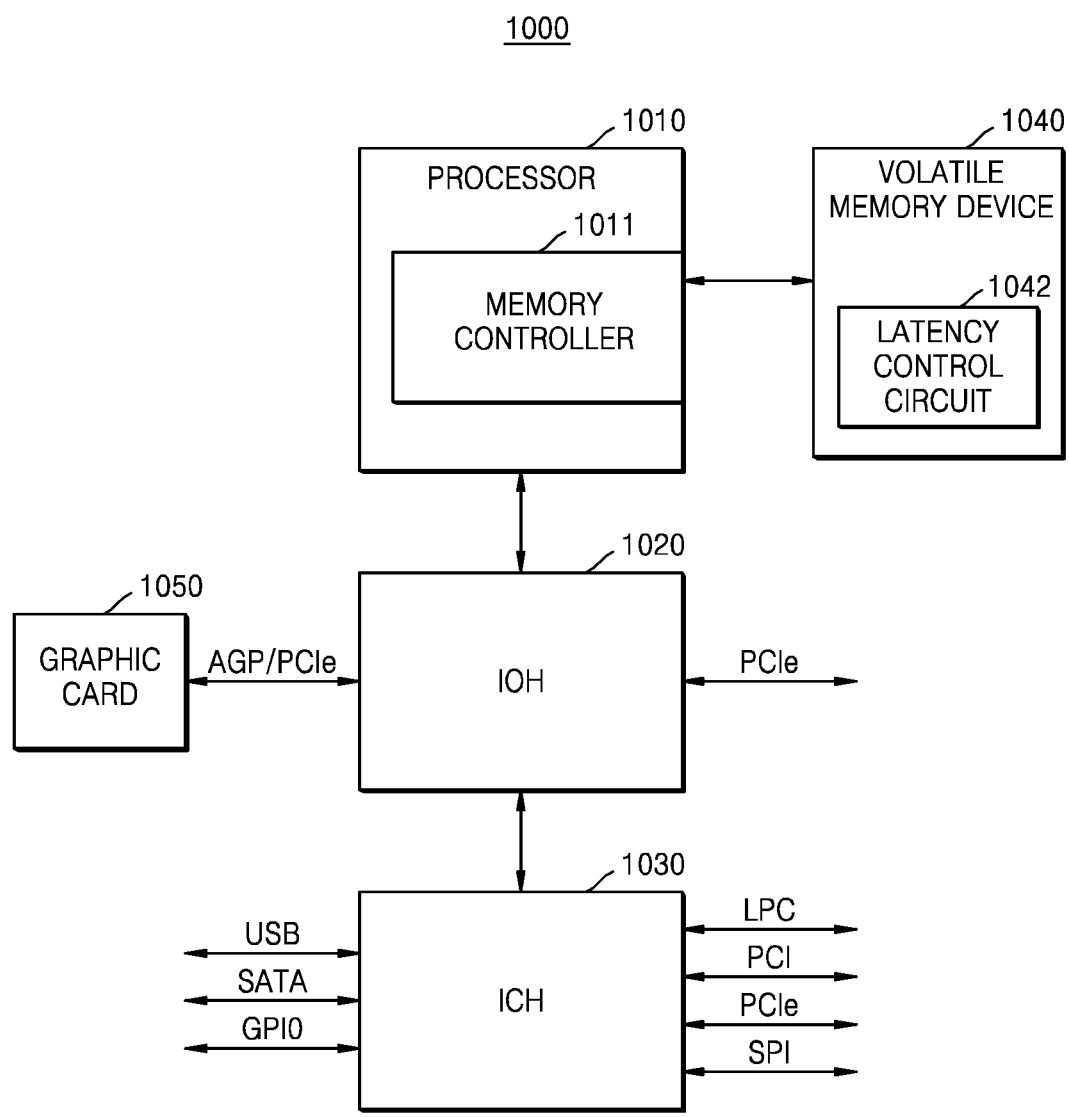
FIG. 10 is a block diagram of a computing system applying a memory device including a latency control circuit according to a certain embodiment.

FIG. 10 is a block diagram of an example of applying a memory device including a latency control circuit according to certain embodiments to a computing system 1000.

Referring to FIG. 10, the computer system 1000 may include a processor 1010, an I/O hub 1020, an I/O controller hub 1030, a memory device 1040, and a graphic card 1050. In some embodiments, the computer system 1000 may be an arbitrary computing system, such as a personal computer (PC), a server computer, a workstation, a laptop, a mobile phone, a smartphone, a PDA, a PMP, a digital camera, a digital television (TV), a set-top box, a music player, a portable game console, and a navigation system.

The processor 1010 may execute various computing functions, such as specific calculations or tasks. For example, the processor 1010 may be a microprocessor (MP) or a central processing unit (CPU). In some embodiments, the processor 1010 may include a single core or a multi-core. For example, the processor 1010 may include a dual-core, a quad-core, or a hexa-core. Although FIG. 10 illustrates the computing system 1000 including one processor 1010, but the inventive concept is not limited thereto. In some embodiments, the computing system 1000 may include a plurality of processors. In some embodiments, the processor 1010 may further include a cache memory, which is located inside or outside the processor 1010.

The processor 1010 may include a memory controller 1011 configured to control an operation of the memory device 1040. The memory controller 1011 included in the processor 1010 may be referred to as an integrated memory controller (IMC). In some embodiments, the memory controller 1011 may be located in the I/O hub 1020. The I/O hub 1020 including the memory controller 1011 may be referred to as a memory controller hub (MCH).

The memory device 1040 may include a latency control circuit 1042, which may compensate a write latency corresponding to a write command for a delay time on a data input path in response to a clock signal and generate a write latency control signal. The latency control circuit 1042 may be a latency control circuit disclosed herein. The memory device 1040 may immediately align and latch write data, which is input to a data bus in response to the write latency control signal, and provide the latched write data to a memory cell array. The memory device 1040 may compensate a read latency corresponding to a read command for a delay time on a data output path in response to a clock signal and generate a read latency control signal. The memory device 1040 may output read data read from the memory cell array in response to the read latency control signal and output the read data to the data bus.

The I/O hub 1020 may manage transmission of data between devices (e.g., the graphic card 1050) and the processor 1010. The I/O hub 1020 may be connected to the processor 1010 through various interfaces. For example, the I/O hub 1020 and the processor 1010 may be connected by various standard interfaces, such as a front side bus (FSB), a system bus, HyperTransport (HT), a lightening data transport (LDT), QuickPath Interconnect (QPI), a common system interface (CSI), or a peripheral component interface-express (PCIe). FIG. 10 illustrates the computing system 1000 including one I/O hub 1020, but the inventive concept is not limited thereto. In other embodiments, the computing system 1000 may include a plurality of I/O hubs.

The I/O hub 1020 may provide various interfaces with devices. For example, the I/O hub 1020 may provide an accelerated graphics port (AGP) interface, a peripheral component interface-express (PCIe), or a communications streaming architecture (CSA) interface.

The graphic card 1050 may be connected to the I/O hub 1020 via an AGP or PCIe. The graphic card 1050 may control a display device (not shown) configured to display images. The graphic card 1050 may include an internal processor for processing image data and an internal semiconductor memory device. In some embodiments, the I/O hub 1020 may include a graphics device along with or instead of the graphic card 1050 located outside the I/O hub 1020. The graphics device included in the I/O hub 1020 may be referred to as an integrated graphics. Also, the I/O hub 1020 including a memory controller and the graphics device may be referred to as a graphics and memory controller hub (GMCH).

The I/O controller hub 1030 may perform a data buffering operation and an interface arbitration operation such that various system interfaces may efficiently operate. The I/O controller hub 1030 may be connected to the I/O hub 1020 via an internal bus. For example, the I/O hub 1020 and the I/O controller hub 1030 may be connected by a direct media interface (DMI), a hub interface, an enterprise southbridge interface (ESI), or PCIe.

The I/O controller hub 1030 may provide various interfaces with peripheral devices. For example, the I/O controller hub 1030 may provide a universal serial bus (USB) port, a serial advanced technology attachment (SATA) port, general-purpose I/O (GPIO), a row pin count (LPC) bus, a serial peripheral interface (SPI), a PCI, or a PCIe.

In some embodiments, at least two of the processor 1010, the I/O hub 1020, or the I/O controller hub 1030 may be embodied by a single chipset.

While the present disclosure has been particularly shown and described with reference to embodiments thereof, it will be understood that various changes in form and details may be made therein without departing from the spirit and scope of the disclosure as defined by the appended claims.

What is claimed is:

1. A latency control circuit for a memory device, comprising:
   a latency compensation circuit configured to generate a latency selection signal according to a loop delay pulse corresponding to a first delay time that is a time taken for a clock signal to reach a data input circuit configured to receive write data;
   a delay circuit configured to generate, in response to the latency selection signal, a first write delay signal at a time point, which leads a write latency corresponding to a write command by the first delay time; and
   a data input path replica circuit configured to delay the first write delay signal by the first delay time, and output a latency control signal,
   wherein the latency control circuit is configured such that the latency control signal aligns write data with the clock signal, which is input after the write latency, and latches the write data as internal write data.

2. The latency control circuit of claim 1, wherein the latency control circuit further comprises a delayed locked loop (DLL) circuit configured to delay the first write delay signal by a second delay time that is a time taken for the write command to reach the delay circuit, and to generate a second write delay signal, and
   wherein the data input path replica circuit is configured to delay the second write delay signal by the first delay time.

3. The latency control circuit of claim 2, wherein the loop delay pulse is generated based on an amount of delay time, which is a sum of the first delay time and the second delay time.

4. The latency control circuit of claim 3, wherein the first write delay signal is generated at a time point, which leads the write latency by an amount of time that is the sum of the first delay time and the second delay time.

5. The latency control circuit of claim 1, wherein the latency compensation circuit comprises:
   a delay measure circuit configured to output a loop delay encoding signal generated by converting the loop delay pulse into a binary code, in response to the clock signal; and
   a latency select signal generation circuit configured to output the latency selection signal based on the write latency and the loop delay encoding signal.

6. The latency control circuit of claim 5, wherein the delay measure circuit comprises:
   a plurality of flip-flops configured to receive the loop delay pulse and output loop delay signals corresponding to the loop delay pulse in response to the clock signal; and
   an encoder configured to encode the loop delay signals and output the loop delay encoding signal.

7. The latency control circuit of claim 5, wherein the latency select signal generation circuit comprises a plurality of 1-bit full adders configured to receive respective write latency signals based on each of respective loop delay encoding signals and to output respective latency selection signals, and wherein the plurality of 1-bit full adders are connected in series such that a carry output of a previous stage is provided as a carry input of a present stage.

8. The latency control circuit of claim 1, wherein the delay circuit comprises:

a decoder configured to decode the latency selection signal;

a first flip-flop configured to receive a write flag signal generated by the write command, in response to the clock signal;

a first multiplexer configured to receive a first input and a second input, and configured to select and output the first input or the second input in response to an output of the decoder; and a second flip-flop configured to receive the output of the first multiplexer in response to the clock signal, wherein the first multiplexer and the second flip-flop constitute a single delay unit, wherein a plurality of delay units are connected in series, and an output of a second flip-flop of a final delay unit of the delay units is output as the first write delay signal, and wherein the write flag signal is applied to the first input of each of the first multiplexers of the delay units, and an output of the second flip-flop of a previous delay unit is applied to the second input of each of the first multiplexers of the delay units.

9. The latency control circuit of claim 1, wherein the latency control circuit is configured to output the latency control signal to a data input circuit and a data output circuit of the memory device.

10. A memory device comprising:

a clock buffer configured to receive a clock signal and output an internal clock signal;

a command decoder configured to receive a write command and output a write signal;

a latency control circuit configured to compensate, in response to the internal clock signal, a write latency corresponding to the write command for a first delay time on a data input path, and generate a latency control signal; and a data input circuit configured to latch write data input to a data bus, in response to the latency control signal, wherein a first data of the write data is aligned with the latency control signal.

11. The memory device of claim 10, wherein the latency control circuit delays the write signal until a time point, which leads the write latency by the first delay time, in response to the internal clock signal, delays the write signal by the first delay time, and outputs a delayed write signal as the latency control signal.

12. The memory device of claim 11, wherein the first delay time is an amount that is a sum of a delay time which is a time taken for the internal clock signal to reach the data input circuit, and a delay time which is a time taken for the write command to reach the latency control circuit.

13. The memory device of claim 10, further comprising:
a memory cell array including a plurality of memory cells arranged in rows and columns, wherein the write data, which is input to the data input circuit after the write latency, is aligned with the internal clock signal, latched as internal write data, and provided to the memory cell array in response to the latency control signal.

14. The memory device of claim 10, wherein the command decoder is further configured to receive a read command and output a read signal, and wherein the latency control circuit is further configured to compensate, in response to the internal clock signal, a read latency corresponding to the read command for a second delay time on a data output path and generate the latency control signal.

15. The memory device of claim 14, further comprising:
a memory cell array including a plurality of memory cells arranged in rows and columns; and a data output circuit configured to output read data, which is read from the memory cell array, to the data bus in response to the latency control signal.

16. The memory device of claim 15, wherein the second delay time is a sum of a delay time which is a time taken for the internal clock signal to reach the data output circuit, and a delay time which is a time taken for the read command to reach the latency control circuit.

17. A memory device including a memory cell array configured to write data based on a write latency according to a write command, the memory device comprising:

a clock buffer configured to receive a clock signal and output an internal clock signal;

a command decoder configured to receive the write command and output a write signal in response to the internal clock signal;

a first circuit configured to receive the write signal and generate a first write delay signal aligned with the internal clock signal, the first write delay signal output at a first time point which is a time leading a first delay time before an ending time of the write latency;

a second circuit configured to generate a latency control signal by delaying the first write delay signal for the first delay time; and a data input circuit configured to transmit write data aligned with the internal clock signal in response to the latency control signal, wherein a first data of the write data is aligned with the latency control signal.

18. The memory device of claim 17, wherein the first delay time corresponds to a second delay time taken for the internal clock signal to reach the data input circuit, a third delay time taken for the write command to reach the first circuit, or a fourth delay time which is a sum of the second and third delay times.

19. The memory device of claim 18, wherein the second circuit includes:

a delay locked loop (DLL) circuit configured to generate a second write delay signal by delaying the first write delay signal for the second delay time; and a replica circuit configured to generate the latency control signal by delaying the second write delay signal for the first delay time.

20. The memory device of claim 18, further comprising:
a latency compensation circuit configured to generate a latency selection signal according to a loop delay pulse corresponding to the first delay time or the fourth delay time, and transmit the latency selection signal to the first circuit.

* * * * *